United States Patent [19]
LeCroy, Jr.

[11] Patent Number: 5,257,025
[45] Date of Patent: Oct. 26, 1993

[54] HIGH-SPEED SAMPLING ARRANGEMENT AND APPARATUS USING SAME

[75] Inventor: Walter O. LeCroy, Jr., Piermont, N.Y.

[73] Assignee: LeCroy Corporation, Chestnut Ridge, N.Y.

[21] Appl. No.: 743,695

[22] Filed: Jun. 11, 1985

Related U.S. Application Data

[63] Continuation of Ser. No. 367,374, Apr. 12, 1982, abandoned.

[51] Int. Cl.[5] .............................................. H03M 9/00
[52] U.S. Cl. .................................. 341/100; 341/101; 341/122; 328/107
[58] Field of Search ................. 340/347 AD, 347 SH, 340/347 DD; 370/112; 328/107; 365/45; 341/99, 100, 50, 122, 123, 126, 155

[56] References Cited

U.S. PATENT DOCUMENTS

| | | | |
|---|---|---|---|
| 3,061,682 | 10/1962 | Cirone | 370/112 |
| 3,142,822 | 7/1964 | Martin | 365/45 |
| 3,714,623 | 1/1973 | Mickler | 365/45 |
| 3,820,112 | 6/1974 | Roth | 340/347 AD |
| 3,885,167 | 5/1975 | Berglund | 340/347 DD |

OTHER PUBLICATIONS

Sheingold, Analog-Digital Conversion Handbook, pp. II-32 through II-45, Jun., 1972.

Primary Examiner—William M. Shoop, Jr.
Attorney, Agent, or Firm—Curtis, Morris & Safford

[57] ABSTRACT

High-speed sampling apparatus includes a first source of sampling pulses exhibiting a first sampling frequency and a first sampling circuit coupled to receive an input signal and responsive to the sampling pulses to produce first signal samples. A second source of sampling pulses exhibiting a second sampling frequency is provided; and a second sampling circuit is coupled to the first sampling circuit to receive predetermined ones of the first signal samples and is responsive to the sampling pulses at the second sampling frequency to sample the predetermined first signal samples so as to produce therefrom second signal samples.

11 Claims, 5 Drawing Sheets

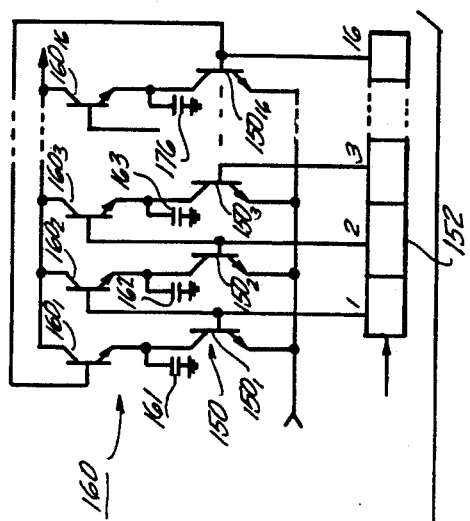
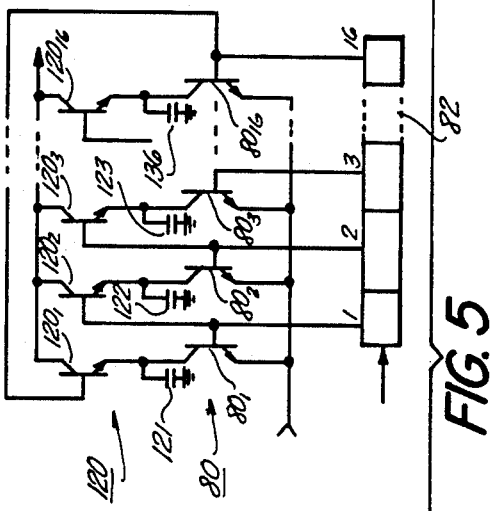
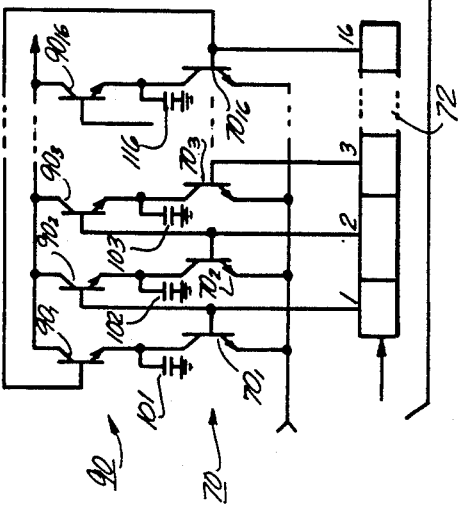
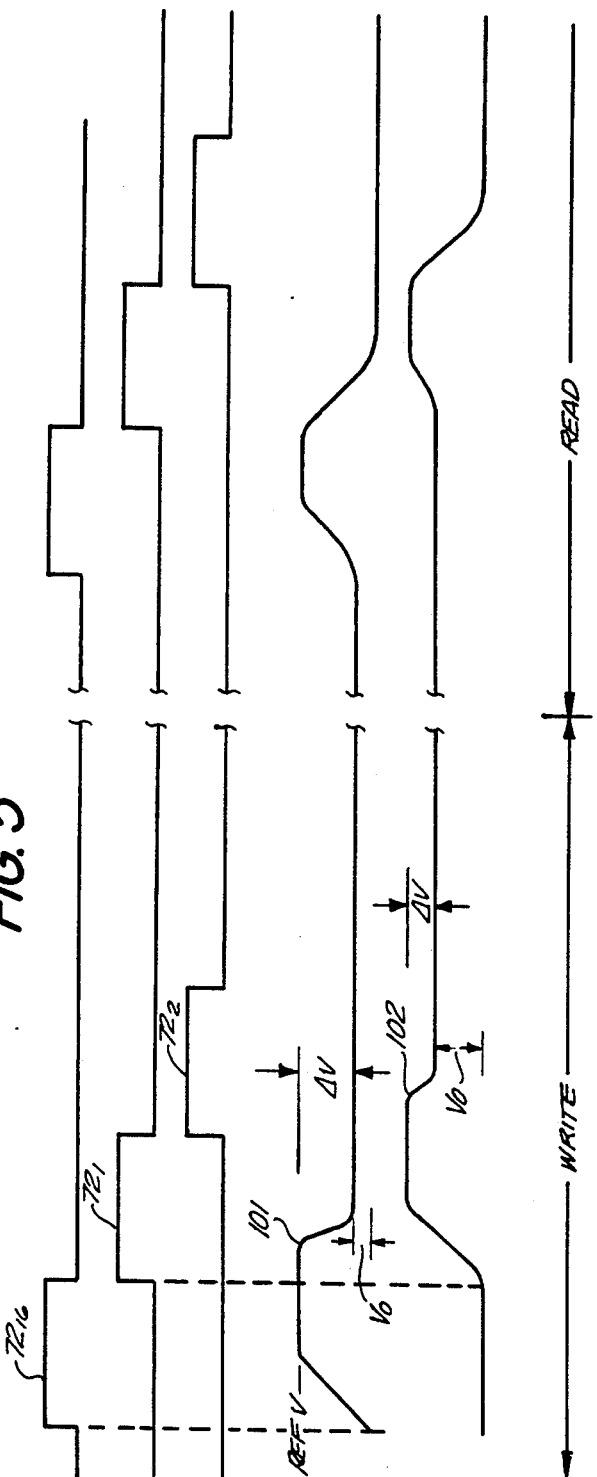
FIG. 5
FIG. 6A
FIG. 6B
FIG. 6C
FIG. 6D
FIG. 6E

HIGH-SPEED SAMPLING ARRANGEMENT AND APPARATUS USING SAME

This application is a continuation of application Ser. No. 367,374, filed Apr. 12, 1982 now abandoned.

BACKGROUND OF THE INVENTION

This invention relates to sampling apparatus and, more particularly, to sampling apparatus which is capable of sampling an input signal at very high sampling rates in excess of 1,000 MHz, and to analog-to-digital converting apparatus which incorporates such sampling apparatus.

In conventional analog-to-digital converters, an input analog signal is sampled at a predetermined quantizing rate, and each sample of the input signal is quantized and converted to a corresponding digital signal representative thereof. In accordance with the well-known Nyquist theory, the minimum sampling rate must be at least twice the highest frequency of the input signal. Difficulties arise when the input signal includes very high frequency components.

One technique which has been proposed to digitize a high frequency analog signal incorporates a dual cathode ray tube wherein one electron beam is used to write, or store, the high frequency input signal on a suitable target, and the other beam is used to sample the signal stored on that target, the sampled signals thereafter being digitized. The stored signal may be read at a relatively slow rate that is compatible with typical slow-speed analog-to-digital converters. This system is, however, complex and expensive.

Another proposal for digitizing higher frequency analog signals incorporates the use of charge coupled devices (CCDs). The CCDs are clocked at a relatively high rate that is compatible with the high frequencies of the input signal so as to store and shift from one stage to the next discrete samples of that input signal. When a suitable number of samples has been stored on the CCD elements, further sampling is interrupted, and the stored samples then are shifted out of the CCD at a slow rate and converted to corresponding digital values. Alternatively, only selected ones of the stored signals are digitized, thereby reducing the effective rate of the samples which are converted into digital form.

Yet another proposal contemplates the use of several analog-to-digital converters connected in parallel to receive the input analog signal. These converters are sampled, or triggered, sequentially so as to produce corresponding sequential digital values of the input signal. This, however, requires the input signal to be amplified substantially, and conventional amplifiers that exhibit satisfactory gain also exhibit a relatively slow speed of response. Hence, the amplifier is not capable of following the rapid changes in the higher frequency components of the input signal. Also, the several converters unavoidably exhibit different sampling characteristics, thus making accurate reconstruction of the original signal quite difficult.

Yet a further proposal contemplates the use of a tapped delay line having sampling circuits coupled to each tap. When the input signal has been propagated through the delay line, all of the sampling circuits may be triggered so as to produce corresponding samples of the input signal related to the incremental delays between adjacent taps. In this proposal, however, when a sample is taken at one tap, interference due to that sample is introduced into the delay line so as to distort the delayed signal. Consequently, the next sample will be a sample of the distorted signal, thereby introducing errors into the analog-to-digital conversion.

The foregoing proposals exhibit highly complex and expensive apparatus and, moreover, are not capable of operating satisfactorily at the high sampling rates which often are desired. In particular, none of the aforementioned proposals contemplates a relatively simple, low-cost sampling circuit which is operable to sample an input signal in excess of 1,000 MHz (i.e. 1,000,000,000 samples per second).

While it has been proposed to produce sampling pulses of very narrow width, such as on the order of 1 psec ($1 \times 10^{-12}$ sec), in order to sample high frequency or transient components, such narrow samples typically are generated at a very slow sampling rate, such as one narrow sample every one msec. Hence, the information that may be present in the interval between adjacent samples will not be detected. It is desirable, therefore, to generate succesive samples at the rate of one every nanosecond (one every $10^{-9}$ seconds).

OBJECTS OF THE INVENTION

Accordingly, it is an object of the present invention to provide improved high-speed sampling apparatus which is of relatively simple construction and low cost, and avoids the aforenoted problems, difficulties and disadvantages of the above-mentioned proposals.

Another object of this invention is to provide sampling apparatus which is capable of sampling an input signal at a very high rate in excess of 1,000 MHz, with successive, narrow sampling pulses and at sampling rates up to 10,000 MHz.

A further object of this invention is to provide high-speed sampling apparatus which is readily adapted for use in an analog-to-digital converter.

A still further object of this invention is to provide an improved high-speed sampling apparatus which may be constructed in accordance with typical integrated circuit fabrication techniques.

An additional object of this invention is to provide an improved high-speed sampling apparatus which may be fabricated on a single integrated circuit chip.

Another object of this invention is to provide sampling apparatus which successfully generates rapid samples, in succession, at one point in space and time to enable the sampling of transients and other high frequency components.

A further object of this invention is to provide sampling apparatus of the aforementioned type which preserves the accuracy of the samples that are obtained in rapid succession, thereby enabling accurate digitization of the sampled signal.

Another object of this invention is to provide high-speed sampling apparatus wherein the sampling circuits are arranged as a multi-level sampling tree, with each level of the tree being supplied with a respective signal sample derived from the preceding level, and with each level of the tree being responsive to different sampling pulse phases, the frequency of the sampling pulses supplied to one level being less than the frequency of the sampling pulses supplied to the preceding level.

Various other objects, advantages and features of the present invention will become readily apparent from the ensuing detailed description, and the novel features will be particularly pointed out in the appended claims.

SUMMARY OF THE INVENTION

In accordance with this invention, high-speed sampling apparatus is provided for sampling an input signal. A first sampling circuit is coupled to receive the input signal and is responsive to sampling pulses at a first sampling frequency to produce first signal samples. A second sampling circuit is coupled to the first sampling circuit to receive predetermined ones of the first signal samples and is responsive to sampling pulses at a second sampling frequency to sample the predetermined first signal samples so as to produce therefrom second signal samples. Preferably, the second sampling frequency is a sub-multiple of the first sampling frequency.

In accordance with one aspect of this invention, the first and second sampling circuits are included in respective sets, including an input set and an output set of switching circuits. Each set of switching circuits is arranged in groups, with each group having a common input and a plurality of outputs. A group of switching circuits in the output set has its common input connected to a predetermined output of a group in the preceding set of switching circuits. The sampling pulses supplied to the switching circuits in a group included in the output set all exhibit the same frequency but different phases.

In accordance with another aspect of this invention, at least the second sampling circuit is comprised of multiple switching elements, each switching element being supplied with a respective phase of sampling pulses such that the switching elements are actuated in response to such respective phases in a predetermined sequence.

In yet another aspect of this invention, the sampling circuits are arranged as a multi-level tree of switching devices, including an input level and an output level. Each level includes a plurality of outputs, and the output of a particular switching device in one level is coupled to the input of a predetermined group of switching devices included in the next-succeeding level. The sampling pulses which are supplied to the switching devices in one level are derived from the sampling pulses that are supplied to the switching devices in the next-preceding level; and in one embodiment, a shift register propagates a preceding-level sampling pulse therethrough to produce the sampling pulses for the next-level switching devices.

Yet another aspect of this invention includes the provision of storage devices coupled to the output set, or level, of the sampling circuits. Preferably, these storage devices are capacitance elements; and a control circuit is coupled thereto to control the writing in and reading out of samples. In one embodiment, the control circuit includes a reset circuit coupled to each capacitance element, the reset circuit being actuated prior to the actuation of a switching element included in the output set, or level, of switching circuits so as to supply a predetermined potential to the capacitance elements before samples are written thereinto. In one embodiment, the same switching element that is used to reset the capacitance element also is used to read out the sample stored thereon. Another aspect of this invention is to convert the input analog signal into a corresponding current, and to supply samples of the input current to the capacitance elements.

A further aspect of this invention is to couple the outputs of the output set, or level, of sampling circuits to digitizing apparatus. When capacitance storage elements are used, as mentioned hereinabove, the samples stored thereacross are read out in a predetermined sequence to such digitizing apparatus. The read-out rate may be less than the rate at which samples are written into the storage capacitance elements.

BRIEF DESCRIPTION OF THE DRAWINGS

The following detailed description, given by way of example, will best be understood in conjunction with the accompanying drawings in which:

FIG. 5 is a schematic diagram of a portion of the embodiment shown in FIG. 2; and FIGS. 6A–6E are waveform diagrams which arc useful in understanding the manner in which samples are written into and read out of storage elements in the embodiment of FIG. 5.

DETAILED DESCRIPTION OF CERTAIN PREFERRED EMBODIMENTS

Figure 1:
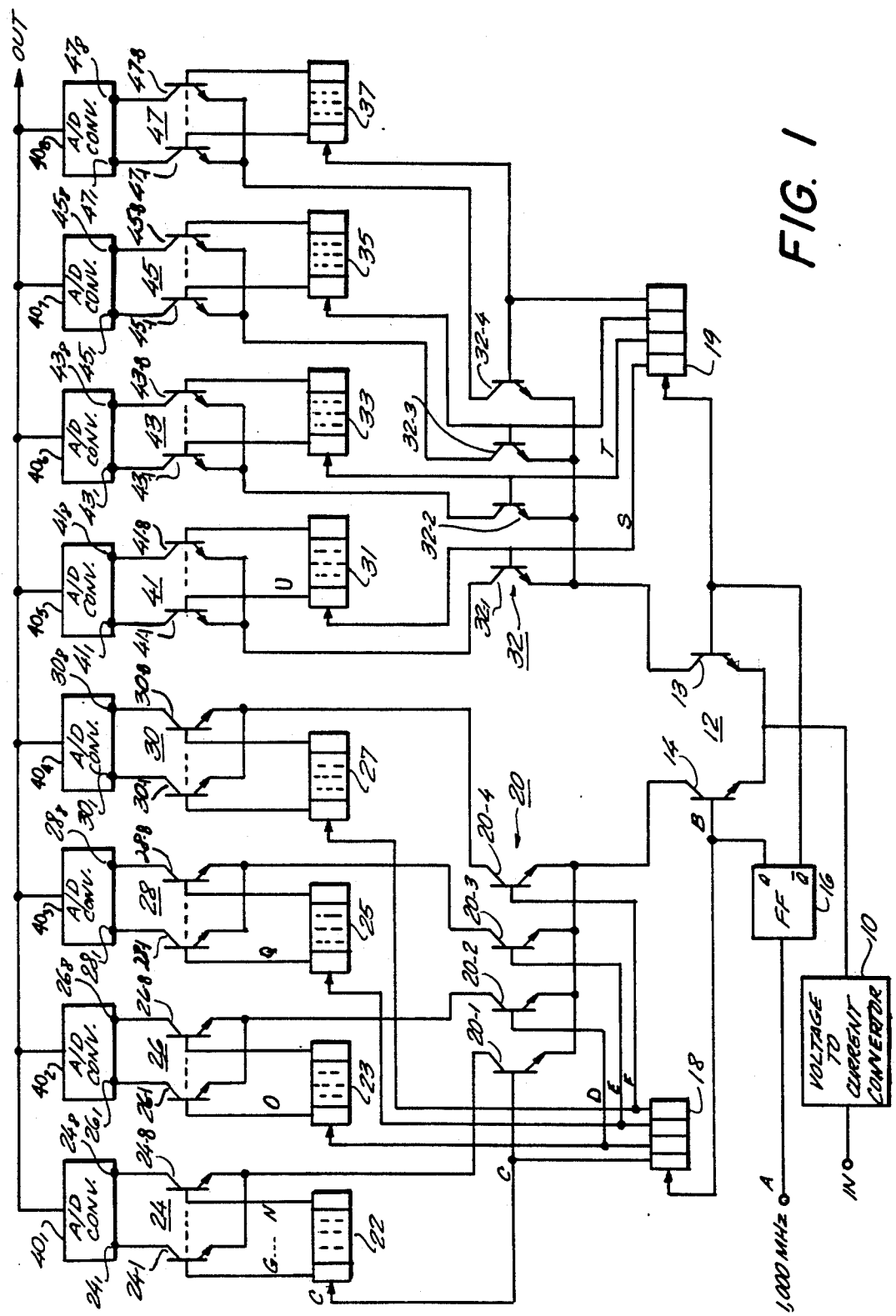
FIG. 1 is a schematic diagram of one embodiment of the present invention.

Referring now to the drawings, and particularly to FIG. 1 thereof, there is illustrated one embodiment of high-speed sampling apparatus in accordance with the present invention. The illustrated apparatus includes plural cascaded sets, or levels, of sampling circuits including an input set, or level 12, an output set, or level, including sampling circuits 24, 26, 28, 30, 41, 43, 45 and 47 and an intermediate set, or level, comprised of sampling circuits 20 and 32. These sets are seen to be cascaded from the input set to the intermediate set to the output set. Input set 12 is, in the illustrated embodiment, comprised of a pair of switching elements 13 and 14. In one embodiment, the switching elements are comprised of transistor devices; and as shown in FIG. 1, such transistor devices may, for example, be bi-polar transistors. It will be appreciated by those of ordinary skill in the art that other types of transistor devices which are capable of operating at high switching frequencies may be used; and, moreover, the switching elements need not be limited solely to transistor devices. However, in the interest of brevity and simplification, it is assumed, for the purpose of discussion, that the illustrated switching elements are formed of transistor switching devices.

Input set 12 of switching devices 13, 14 includes a common-connected input, here illustrated as the emitter electrodes of transistors 13 and 14, adapted to be supplied with an input signal to be sampled. An input sample is obtained by actuating the switching device in response to a sampling signal supplied thereto. In particular, the sampling signal, such as a sampling pulse, supplied to the base electrode of, for example, transistor switch 14 renders this transistor switch conductive so as to couple the signal supplied to the emitter electrode thereof to its collector electrode. Switching devices 13 and 14 are operated, or actuated, at the same sampling rate, but at different respective phases. In particular, the switching devices are actuated alternately.

The sampling pulses supplied to input set 12 are derived from a clock source (not shown) capable of generating stable, high frequency clock pulses on the order of, for example, 1,000 MHz. A frequency divider 16, formed of, for example, a flip-flop circuit, is coupled to the clock source and functions to divide the frequency of the clock pulses by the factor 2. As is conventional, flip-flop circuit 16 includes a pair of outputs Q and $\overline{Q}$, these outputs supplying sampling pulses at, for example, 500 MHz and in opposite phases. Flip-flop circuit 16 may be thought of as a single stage shift register.

Since input set 12 of switching devices 13, 14 is comprised of only two switching devices in the example described herein, the input set is provided with two outputs. These outputs are coupled to respective inputs of the next set of sampling circuits. In the illustrated embodiment, this next set is comprised of the intermediate set, or level, of sampling circuits 20 and 32. Sampling circuits 20 and 32 may be thought of as separate groups of switching devices. These groups are of substantially identical construction, and only the group which comprises sampling circuit 20 need be described in detail.

In the illustrated example, sampling circuit 20 is comprised of four switching devices 20-1, 20-2, 20-3 and 20-4, respectively. Although any desired number of switching devices may be used, it is preferred herein to utilize four switching devices in sampling circuit 20. These switching devices may be similar to aforedescribed switching devices 13 and 14; and in the embodiment described herein, switching devices 20-1 . . . 20-4 are diagrammatically represented as transistor elements. The input of sampling circuit 20 is comprised of the common-connected inputs, or emitter electrodes, of switching devices 20-1, 20-2, 20-3 and 20-4. As illustrated, this input is coupled to the output, or collector electrode, of switching device 14 included in the input set 12 of sampling circuits. Similarly, the input of sampling circuit 32 is comprised of common-connected emitter electrodes coupled to the output, or collector electrode, of switching device 13.

Switching devices 20-1, 20-2, 20-3 and 20-4 are actuated, or rendered conductive, in sequence. The actuation, or conductivity, of these switching devices is determined by the successive phases of sampling pulses supplied thereto by a source of intermediate level sampling pulses 18. In a similar manner, the respective switching devices included in sampling circuit 32 are actuated, or rendered conductive, in sequence, by the respective phases of sampling pulses supplied thereto from source 19. Sources 18 and 19 may be thought of as suitable sampling pulse (or clock pulse) generators, each coupled to a respective output of flip-flop circuit 16 to receive a respective phase of the first-level sampling pulses. More particularly, each of sampling pulse sources 18 and 19 is comprised of a plural-stage shift register adapted to receive a sample pulse generated by flip-flop circuit 16 to propagate a pulse through the respective stages thereof. Each stage of shift register 18 is coupled to a respective control terminal, or base electrode, of switching devices 20-1, 20-2, 20-3 and 20-4. Likewise, each stage of shift register 19 is coupled to a respective control terminal of the switching devices included in sampling circuit 32. Thus, as a pulse is shifted from stage-to-stage in shift register 18 in response to each sampling pulse supplied thereto from flip-flop circuit 16, successive ones of the switching devices included in sampling circuit 20 are actuated, or rendered conductive. It is appreciated that when a switching device is actuated, a signal supplied to the input thereof, that is, the signal supplied to the common-connected inputs of the switching devices, is switched, or transferred, to the output of that actuated switching device.

The output of each switching device included in sampling circuit 20 is coupled to the input of a respective sampling circuit included in the output set, or level. Similarly, each output of sampling circuit 32 is coupled to the input of a respective sampling circuit included in the output set, or level. In the interest of brevity, only output sampling circuits 24, 26, 28 and 30 are described in detail. In the example described herein, each sampling circuit included in the output set, or level, is comprised of eight individual switching devices; and, preferably, each such switching device is similar to the aforedescribed switching devices included in sampling circuits 20 and 32. Any other number of switching devices may be included in sampling circuits 24, 26, 28, 30, 41, 43, 45 and 47, as desired.

Sampling circuit 24 is illustrated in detail, and the switching devices 24-1 . . . 24-8 included therein have their inputs, or emitter electrodes, connected in common to the output, or collector electrode, of switching device 20-1 included in sampling circuit 20 of the preceding set, or level. Similarly, the inputs of the switching devices included in sampling circuit 26 are connected in common to the output of switching device 20-2, the inputs of the switching devices included in sampling circuit 28 are connected in common to the output of switching device 20-3, and the inputs of the switching devices included in sampling circuit 30 are connected in common to the output of switching device 20-4. Likewise, the inputs of the switching devices included in sampling circuit 41 are connected in common to the output of switching device 32-1, and the remaining sampling circuits 43, 45 and 47 are similarly connected to switching devices 32-2, 32-3 and 32-4, respectively.

The control terminals, or base electrodes, of switching devices 24-1 . . . 24-8 are coupled to a source 22 of sampling pulses. Preferably, source 22 is comprised of a plural-stage shift register whose input is coupled to a predetermined stage of shift register 18. In the illustrated embodiment, the input of shift register 22 is coupled to the output of the first stage of shift register 18. In response to each sampling pulse produced at the first stage of shift register 18, shift register 22 propagates a pulse from one stage therein to the next adjacent stage. The plural stages of shift register 22 are coupled to respective control terminals of switching devices 24-1 . . . 24-8 to sequentially actuate, or render conductive, those switching devices in response to the propagating, or shifting, of a pulse through the shift register.

In a similar manner, the control terminals of the switching devices included in sampling circuit 26 are coupled to the respective stages of a shift register 23 whose input is coupled to, for example, the second stage of shift register 18. Likewise, the control terminals of the switching devices included in sampling circuit 28 are coupled to the respective stages of a shift register 25 whose input is coupled to the third stage of shift register 18. Finally, the control terminals of the switching devices included in sampling circuit 30 are coupled to the respective stages of yet another shift register 27 whose input is coupled to the fourth output of shift register 18. The respective stages of shift register 19 coupled to similar shift registers 31, 33, 35 and 37, whose stages, in turn, are coupled to the control terminals of the switching devices included in sampling circuits 41, 43, 45 and 47, respectively.

The outputs, or collector electrodes, of switching devices 24-1 . . . 24-8 included in sampling circuit 24 are coupled to respective output terminals $24_1 \ldots 24_8$ of the sampling circuit. Likewise, the outputs of the switching devices included in sampling circuit 26 are coupled to respective sampling circuit output terminals $26_1 \ldots 26_8$. Similarly, the outputs of the switching devices included in sampling circuit 28 are coupled to respective output terminals $28_1 \ldots 28_8$; and the outputs of the respective switching devices included in sampling circuit 30 are coupled to output terminals $30_1 \ldots 30_8$. These output terminals of the output set, or level, of sampling circuits are coupled to analog-to-digital (A/D) converting apparatus.

In the embodiment illustrated in FIG. 1, each sampling circuit 24, 26, . . . included in the output set, or level, is coupled to a respective A/D converter. Preferably, each A/D converter is a so-called "flash" converter of the type available from TRW Inc. and others. As is known to those of ordinary skill in the art, a flash converter is adapted to convert a signal sample level to a corresponding digital signal at a rapid read-out, or cycling, rate. A/D converters $40_1$, $40_2$, $40_3$, $40_4$, $40_5$, $40_6$, $40_7$ and $40_8$ have their output terminals connected to a common output. It will be appreciated that the digital signals produced by the A/D converters are supplied to this common input in a predetermined sequence such that there is no interference at the common-connected output terminals. For example, first the digitized signal sample produced by A/D converter $40_1$ in response to the sample provided at output terminal $24_1$ is read out; followed by the reading out of A/D converter $40_5$ of the digitized sample produced in response to the sample provided at output terminal $41_1$. Then, the digitized sample produced by A/D converter $40_2$ in response to the sample provided at output terminal $26_1$ is read out, followed by the reading out of the digitized sample produced by A/D converter $40_6$ in response to the sample provided at output terminal $43_1$. Hence, the digitized samples are read out in accordance with the following sequence: first, all of the digital signals produced in response to the samples supplied to the first inputs of the A/D converters are read out successively, then the digital signals produced by the A/D converters in response to the samples supplied to the second inputs thereof are read out successively, and so on. As a numerical example, eight A/D converters are provided, each having eight separate inputs, thus producing sixty-four successive digitized samples.

It is preferred to supply the input set, or level, of sampling circuits 12 with an input current. This is because currents are switched easily at high speeds by switching transistors, such as bipolar or MOS transistors. Furthermore, a current sample may be stored for relatively long periods of time on simple storage devices, such as capacitors. If a current sample i is switched, or steered, to a storage capacitor during a brief interval of time Δt, the charge that is deposited onto that capacitor is an exact measure of the average current i during that interval:

$$q = \int_{t_i}^{t_2} i\, dt = i\, \Delta t$$

Thus, the stored charge is a sample of the current waveform. The time interval Δt may be made very short, such as 1 nsec. or less, thereby enabling accurate sampling of signals having wide bandwidths. Accordingly, a voltage-to-current converter 10 is coupled to the input of sampling circuit 12. This voltage-to-current converter is adapted to convert an incoming signal voltage to a corresponding current. Then, depending upon the "train" of switching devices which are actuated, or in the cascaded sets, conductive, the input current flows through one or the other of input switching devices 13, 14, and then through one switching device included in the intermediate set, or level, followed by one switching device included in the output set, or level.

Figure 3:
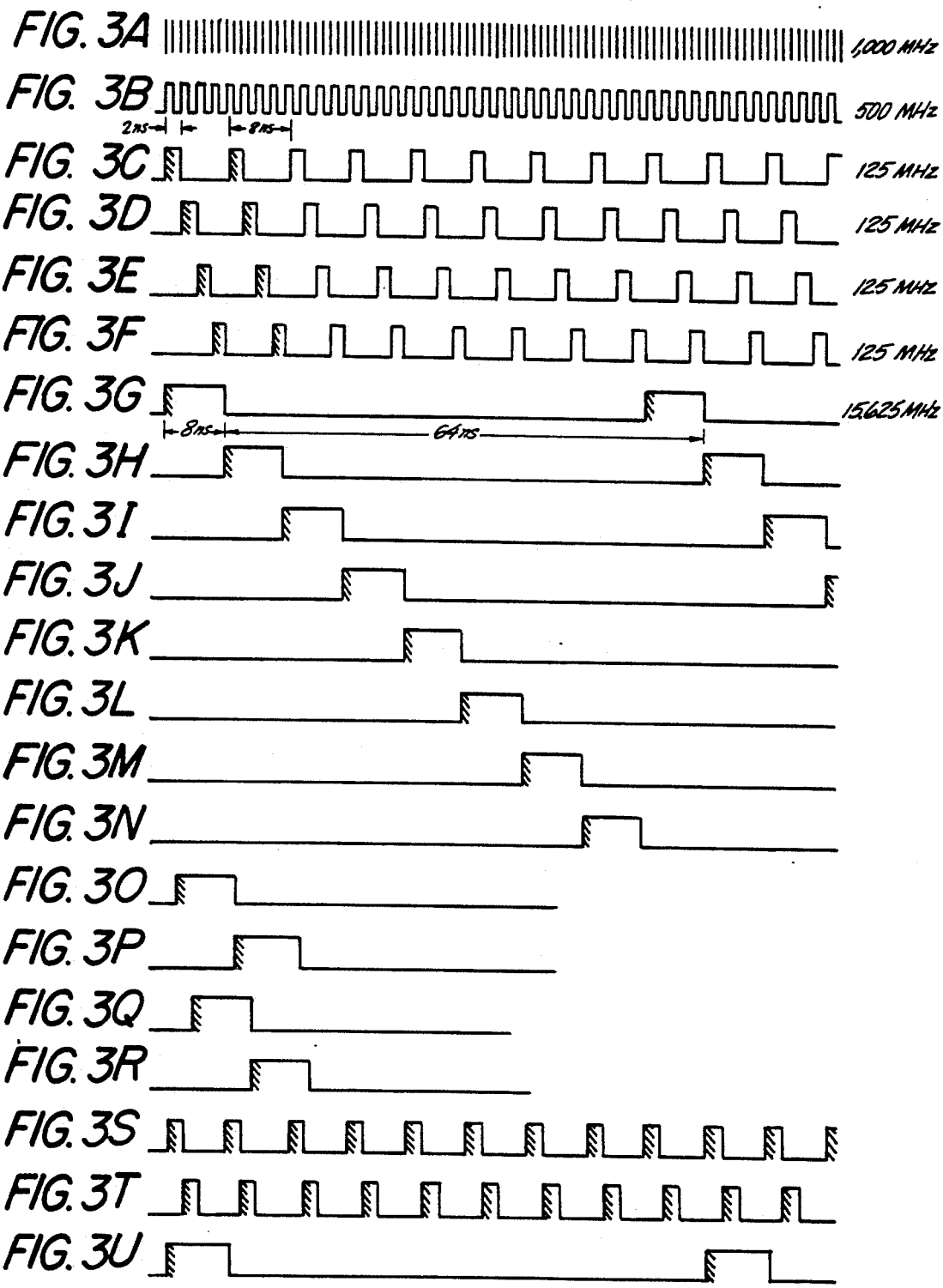
FIGS. 3A–3U are timing diagrams which are useful in understanding the operation of the embodiment shown in FIG. 1.

A timing diagram representing the switched operation of the various switching devices illustrated in FIG. 1 is shown in FIGS. 3A–3U. FIG. 3A represents the clock pulses supplied to flip-flop circuit 16 at the rate of, for example, 1,000 MHz. It is appreciated that the frequency, or pulse repetition rate, of the input clock pulses may be any desired frequency capable of being stably generated. Since flip-flop circuit 16, shift register 18 and shift register 22 each carry out binary frequency division, the frequency of the input clock signal (FIG. 3A) may, for convenience, be an integral multiple of a binary number, such as 1,024 MHz.

Flip-flop circuit 16 functions to divide the frequency of the clock pulses by the factor 2 to produce sampling pulses of opposite, alternate phases. FIG. 3B illustrates the sampling pulses produced at output Q of flip-flop circuit 16. It will be appreciated that the sampling pulses produced at the output $\overline{Q}$ is 180° out of phase with respect to the sampling pulses shown in FIG. 3B. Thus, transistors 14 and 13 are actuated, or rendered conductive, alternately.

The sampling pulses shown in FIG. 3B are supplied to shift register 18, to trigger the same to propagate a pulse through the respective stages of this shift register. FIGS. 3C–3F represent such propagation; and it is seen that the pulses provided at the first stage of shift register 18 (FIG. 3C) exhibit the frequency of 125 MHz and a reference phase assumed herein to be 0°. The sampling pulses shown in FIG. 3D are produced at the second stage of shift register 18, and are seen to exhibit the same sampling frequency of 125 MHz and a phase assumed herein to be 90°. The sampling pulses shown in FIG. 3E are produced by the third stage of shift register 18; and these sampling pulses are seen to exhibit the frequency of 125 MHz and the phase of 180°. Finally, the sampling pulses shown in FIG. 3F are produced by the fourth stage of shift register 18, and exhibit the frequency of 125 MHz and the phase of 270°. The cross-hatched areas of the sampling pulse signals illustrated in FIGS. 3C–3F represent the input signal samples that are transferred through switching devices 20-1 . . . 20-4, respectively, during the duration of each of the respective sampling pulses (FIGS. 3C–3F). Thus, the first sample of the input signal which is produced by switching device 14 (and represented by the cross-hatched area of the first sampling pulse shown in FIG. 3B) is transferred, or switched, through switching device 20-1 during the first half of the duration of the sampling pulse shown in FIG. 3C. The second input signal sample produced by switching device 14 is transferred through switching device 20-2 during the first half of the duration of the sampling pulse shown in FIG. 3D. The third input signal sample produced by switching device 14 is transferred through switching device 20-3 during the first half of the duration of the sampling pulse illustrated in FIG. 3E. Finally, the fourth input signal sample produced by switching device 14 is transferred through switching device 20-4 during the first half of the duration of the sampling pulse shown in FIG. 3F. Thereafter, the foregoing cycle is repeated.

It is appreciated, from the sampling pulses shown in FIG. 3B, that switching device 13 produces samples during the negative half portions of each cycle of the sample pulses shown in FIG. 3B. Shift register 19 generates respective phases of sampling pulses, two of which phases are shown in FIGS. 3S and 3T. The frequency of the pulses shown in FIG. 3S, as well as the frequency of the pulses shown in FIG. 3T, is equal to 125 MHz, the same frequency as the sampling pulses which are produced at each stage of shift register 18. The cross-hatched portion of each pulse shown in FIGS. 3S and 3T represents the input signal sample that is transferred through a respective switching device 32-1 and 32-2 included in sampling circuit 32 during the duration of the pulses shown in FIGS. 3S and 3T.

From the foregoing, it will be appreciated that the first input signal sample produced by switching device 14 is transferred through switching device 20-1, and then the first sample produced by switching device 13 is transferred through switching device 32-1. Thereafter, the second input signal sample produced by switching device 14 is transferred through switching device 20-2, and the next sample produced by switching device 13 is transferred through corresponding switching device 32-2. Hence, sampling circuits 20 and 32 alternate in transferring samples therethrough, and at each alteration, the next switching device included therein is actuated. If desired, the switching devices 20-1, 20-2, ..., and 32-1, 32-2, ..., may be actuated in any other sequence or order.

Shift register 22 responds to the pulses shown in FIG. 3C to propagate a sampling pulse through the plural stages thereof. As a result, sequential phases, each shifted by 45°, are provided at the outputs of the stages of shift register 22, as shown in FIGS. 3G-3N, respectively. It is is seen that the frequency of each phase of these pulses is equal to one-sixteenth the input clock frequency (e.g. approximately 15 MHz), and each pulse exhibits a duration of 8 nsec. The cross-hatched areas shown in FIGS. 3G-3N represent the transfer of the input signal sample through the respective switching devices included in sampling circuit 24 during the duration of each respective phase of the sampling pulses supplied to this sampling circuit. FIGS. 3O and 3P represent two successive phases of the sampling pulses supplied from similar shift register 23 to sampling circuit 26. Likewise, FIGS. 3Q and 3R represent two successive phases of the sampling pulses produced by shift register 25 and supplied to sampling circuit 28.

It will be appreciated that sampling circuits 41, 43, 45 and 47 to which the respective outputs of sampling circuit 32 are coupled are driven by respective, sequential phases produced by shift registers 31, 33, 35 and 37, respectively. FIG. 3U represents one of these phases as produced by the first stage of shift register 31.

In the embodiment shown in FIG. 1, the first input signal sample produced by switching device 14 is coupled through switching device 20-1 and then through switching device 24-1 to A/D converter $40_1$. Thereafter, the first input signal sample produced by switching device 13 is coupled through switching device 32-1 and then through switching device 41-1 to A/D converter $40_5$. The next signal sample is produced by switching device 14, and at this time, shift register 18 actuates switching device 20-2 to couple this sample therethrough and then through the first switching device included in sampling circuit 26. The next signal sample is produced by switching device 13, and this sample is coupled through switching device 32-2 and then through the first switching device included in sampling circuit 43 to A/D converter $40_6$. The next signal sample produced by switching device 14 is coupled through switching device 20-3 and then through the first switching device included in sampling circuit 28 to A/D converter $40_3$. This alternating sequence is repeated until all of the first switching devices included in sampling circuits 24, 26, 28 and 30 as well as in sampling circuits 41, 43, 45 and 47 have been actuated. Then, the sequence is repeated, and each second switching device included in each of the sampling circuits is actuated successively.

It is appreciated that the alternate actuation of switching devices 13 and 14 serves to sample the input signal at the rate of 1,000 MHz. Because of the illustrated multi-level "tree", each switching device included in the output set, or level of sampling circuits, that is, each switching device included in sampling circuits 24, 26, 28 ... is actuated at the rate of approximately 15 MHz. The A/D converters are capable of operating at this 15 MHz rate and, in combination, the A/D converters serve to produce digitized samples at the input sampling rate of 1,000 MHz. Hence, FIG. 1 is a schematic representation of one embodiment of a high-speed sampling circuit, each sample being converted to a corresponding digital representation.

In the embodiment of FIG. 1, it may be appreciated that, if desired, any number of intermediate sets, or levels, of sampling circuits may be used. In general, the input set may be thought of as having n outputs (e.g. n=2); the intermediate set may be thought of as having x outputs in each group of switching devices (e.g. x=4 for each of 2 groups); and the output set may be thought of as having n.x groups with each group having y outputs (e.g. y=8). In the illustrated embodiment only one intermediate set, comprised of two groups of sampling circuits 20 and 32, is used. Furthermore, the high-speed sampling circuit may be modified so as to include only an input and an output set of sampling circuits. In this regard, input sampling circuit 12 may be omitted; and the input signal may be coupled directly to the common-connected input of sampling circuit 20 as well as to the common-connected input of sampling circuit 32.

Still further, each A/D converter may include a storage device, such as a capacitance element, coupled to a respective output terminal of the sampling circuit connected thereto for the purpose of storing each sample. The stored sample then may be digitized at an appropriate rate which, for example, may be less than the 15 MHz rate at which the output sampling circuits are driven.

In the embodiment shown in FIG. 1, it might be thought that the multi-level tree of sampling circuits is a commutator circuit that is analogous to a single-pole-sixty-four-throw electronic switch. This, however, is not the case. Accurate samples at the high sampling rates described herein are not attainable if, for example, sixty-four transistors are connected with their emitter electrodes in common and supplied with the input signal to be successively sampled. This is because the very high base-emitter capacitance which obtains by reason of the common-connected emitters prevents the respective transistors from being switched, or actuated, at high sampling rates. It is known that the inherent base-emitter capacitance of a transistor is effectively increased as more transistors are connected with their emitters in common. Thus, with a large number (e.g. 64) of transistors connected in common, the resultant high capacitance of the common-connected emitters prevents each transistor from responding to the high frequency sampling pulses.

The sets of transistors shown in FIG. 1 are "matched" to the frequencies of the particular sampling pulses supplied thereto and, therefore, overcome the aforenoted problem. For example, the input set of switching devices includes a small number (e.g. 2) of transistors connected in common at their emitters. Hence, the effective emitter capacitance of the input set is relatively low and does not degrade the rapid response of these transistors to the very high frequency sampling pulses supplied thereto. The intermediate set of switching devices is formed of plural (e.g. 2) groups, each group including a somewhat larger number (e.g. 4) of transistors than the input set. Although this increases the effective emitter capacitance in each group of the intermediate set, the frequency of the sampling pulses supplied thereto is less than the input sampling pulses and, consequently, the transistors are fully enabled to respond thereto. Likewise, the output set of switching devices is formed of groups that include a still larger number (e.g. 8) of transistors, but the resultant increase in emitter capacitance thereof is effectively offset, or compensated, by a lower sampling pulse frequency. Hence, the transistors in the output set respond satisfactorily to the sampling pulses supplied thereto. Therefore, those groups of transistors having larger effective capacitances, and thus slower response speeds, are supplied with sampling pulses at a slower rate.

Thus, it is seen that the formation of groups of relatively small numbers of transistors reduces the effective capacitance that otherwise would be present if all of the output transistors were connected together. Another advantage of providing groups of transistors is the relative ease with which clock, or sampling, pulses may be generated. If a single clock generator is used, it is difficult to supply each transistor with its appropriate sampling pulse phase having the proper pulse transitions at the correct times.

By matching the sampling pulse repetition rates to the response speeds of the respective sets, the levels of the input signal samples are accurately preseved as those samples propagate through successive ones of the cascaded sets. A sample is not distorted because a particular transistor cannot be switched fast enough to pass that sample to the next stage.

Figure 2:
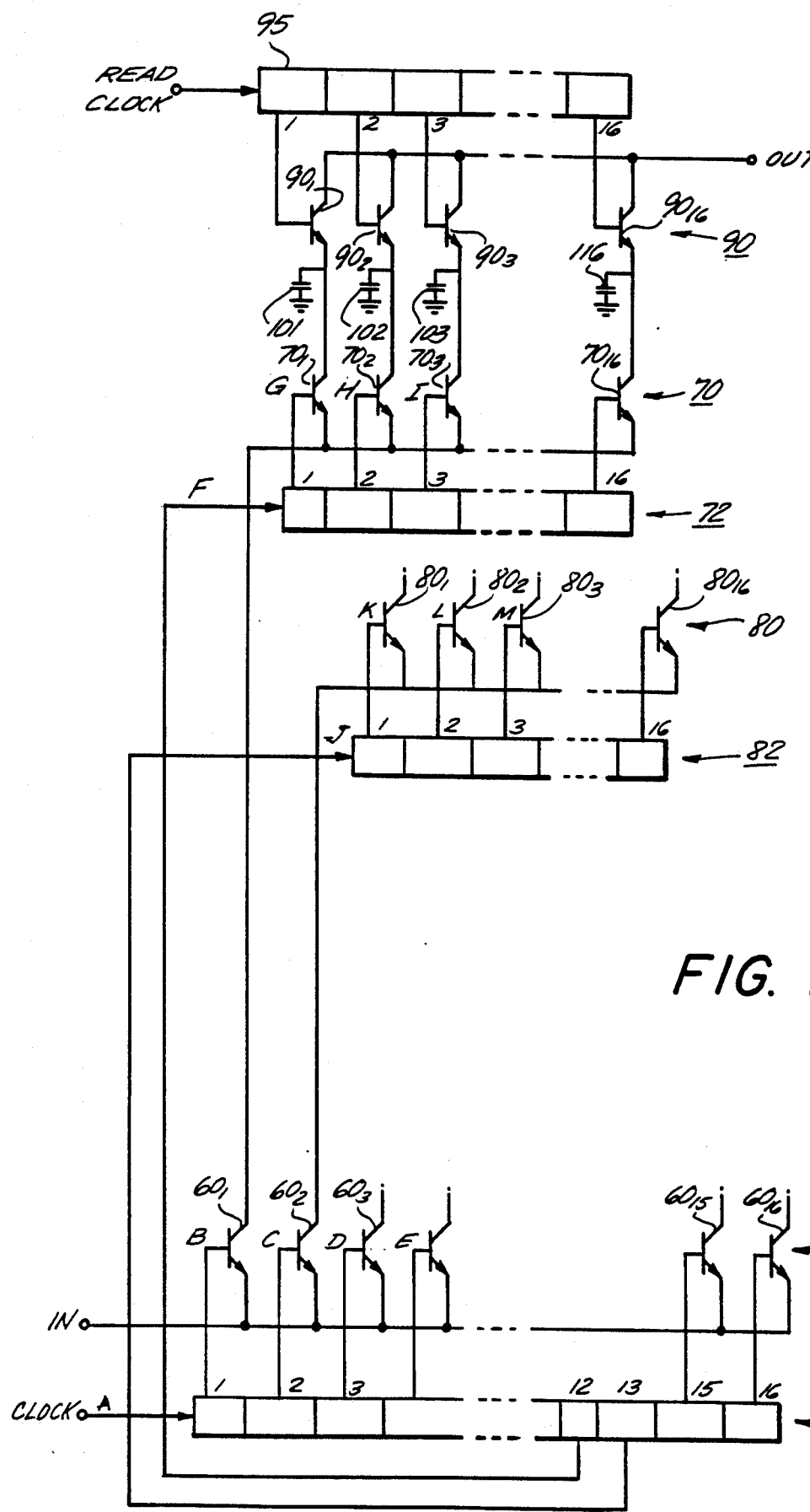
FIG. 2 is a schematic diagram of another embodiment of this invention.

Another embodiment of a high-speed sampling circuit in accordance with the present invention is illustrated in FIG. 2. This embodiment is similar in many respects to the aforedescribed embodiment shown in FIG. 1 and may be fabricated on a single IC chip. In the FIG. 2 embodiment, the input set, or level, may be supplied with, for example, the samples produced by the intermediate set of the FIG. 1 embodiment. The input set of FIG. 2 is illustrated as being comprised of one sampling circuit 60, this sampling circuit being formed of, for example, sixteen individual switching devices $60_1$, $60_2$, $60_3$ ... $60_{16}$. Each of these switching devices may be similar to the aforedescribed switching devices employed in the embodiment of FIG. 1.

The inputs, or emitter electrodes, of switching devices $60_1$ ... $60_{16}$ are connected in common to receive an input signal, such as successive signal samples as mentioned above. Alternatively, the input signal may be an input current to be sampled and may be generated by a voltage-to-current converter similar to converter 10 of FIG. 1. Each switching device $60_1$ ... $60_{16}$ is actuated, or rendered conductive, in sequence. To this effect, a clock generator 62, illustrated herein as a 16-stage shift register, is coupled to the switching devices to supply respective phases of clock, or sample pulses thereto. Shift register 62 is coupled to a clock terminal to receive higher frequency clock pulses on the order of, for example, 250 (or, for convenience, 256) MHz. It is appreciated that shift register 62 serves to divide the frequency of the input clock signal by the factor 16. Each stage of the shift register thus produces a sample pulse of a respective phase of the frequency-divided clock pulse. If, for example, the input clock pulse exhibits the frequency of 256 MHz, then each stage of shift register 62 produces sampling pulses of the frequency 16 MHz and of a respective phase (e.g. 0°, 22.5°, 45°, and so on).

Each switching device $60_1$ ... $60_{16}$ included in input sampling circuit 60 is coupled to a respective sampling circuit included in the output set of sampling circuits. For brevity and simplification, only two of the sampling circuits 70 and 80 included in the output set are illustrated. Sampling circuit 70 is comprised of, for example, sixteen individual switching devices $70_1$, $70_2$, ... $70_{16}$. Likewise, sampling circuit 80 is comprised of, for example, sixteen individual switching devices $80_1$, $80_2$ ... $80_{16}$. It will be appreciated that the number of switching devices included in each sampling circuit illustrated in FIG. 2 may be any desired number. Furthermore, the number of switching devices included in input sampling circuit 60 need not necessarily be equal to the number of switching devices included in each sampling circuit of the output set.

The inputs, or emitter electrodes, of the switching devices included in each sampling circuit are coupled in common. As illustrated in FIG. 2, the common-connected input of sampling circuit 70 is coupled to the output of switching device $60_1$. The common-connected input of sampling circuit 80 is coupled to the output of switching device $60_2$. Thus, each output sampling circuit has its common-connected input coupled to a predetermined one of the switching devices included in input sampling circuit 60.

Switching devices $70_1$ ... $70_{16}$ are actuated, or rendered conductive, in sequence, and at a frequency that is less than the frequency at which switching devices $60_1$ ... $60_{16}$ are actuated. Likewise, switching devices $80_1$ ... $80_{16}$ are actuated, or rendered conductive, in sequence and at the same frequency as switching devices $70_1$ ... $70_{16}$. However, the phases at which the switching devices included in sampling circuit 70 are actuated differ from the phases at which the switching devices included in sampling circuit 80 are actuated. Likewise, although not shown in FIG. 2, the switching circuits included in the remaining output sampling circuits are actuated, or rendered conductive, at the same frequency as the switching devices included in sampling circuit 70, but at different respective phases. In this regard, each output sampling circuit 70, 80, and so on, is associated with and coupled to a respective shift register 72, 82, etc. These shift registers are of similar construction and, for example, shift register 72 is comprised of a 16-stage shift register, each stage being coupled to the control terminal, or base electrode, of a respective switching device $70_1 \ldots 70_{16}$. The input clock terminal of shift register 72 is coupled to a predetermined stage of shift register 62. Thus, shift register 72 serves to divide the frequency of the sampling pulses supplied thereto from shift register 62 by the factor 16, thereby producing respective phases (0°, 22.5°, 45°, and so on) of output sampling pulses, each phase having the frequency of 1 MHz. Accordingly, switching device $70_1$ is actuated at the 1 MHz rate at, for example, 0° phase, switching device $70_2$ is actuated at the 1 MHz rate at, for example, 22.5° phase, and so on.

Shift register 82 also is a 16-stage shift register; and the input clock terminal of shift register 82 is coupled to a different predetermined stage of shift register 62. Since shift registers 72 and 82 are supplied with pulses having different phases, it is appreciated that the sampling pulses produced by shift registers 72 and 82 also exhibit different phases with respect to each other. In the example illustrated in FIG. 2, the twelfth stage of shift register 62 is coupled to the input clock terminal of shift register 72 and the thirteenth stage of shift register 62 is coupled to the input clock terminal of shift register 82. If desired, shift registers 72 and 82 may be coupled to any other desired stages of shift register 62.

It will be appreciated that the embodiment of FIG. 2 overcomes the problem of slow response speed of the transistors due to high emitter capacitance. As in the FIG. 1 embodiment, the effective emitter capacitance is kept relatively low by forming groups of small numbers of emitter-connected transistors. Also, the frequencies of the sampling pulses are matched to the response speeds of the switching devices.

Preferably, the plural outputs of each output sampling circuit 70, 80 and so on, that is, the outputs of the respective switching devices included in such sampling circuits, are coupled to a temporary storage device. In the embodiment illustrated herein, the temporary storage device is an analog storage element, such as a capacitance element. A respective capacitance element 101, 102, 103, ... 116 is coupled to a respective output of the switching devices $70_1$, $70_2$, $70_3 \ldots 70_{16}$ of output sampling circuit 70. The capacitance elements may be of conventional construction known to those of ordinary skill in the art and fabricated in accordance with conventional integrated circuit fabrication techniques. Although not illustrated in FIG. 2, it will be appreciated that similar capacitance elements are coupled to the outputs of sampling circuit 80, as well as to the outputs of the remaining sampling circuits included in the output set, or level.

A read-out circuit 90 is coupled to capacitance elements 101 ... 116; and although not shown, similar read-out circuits are coupled to the capacitance elements which are connected to the outputs of the remaining sampling circuits included in the output set, or level. Advantageously, read-out circuit 90 is comprised of individual switching devices $90_1$, $90_2$, ... $90_{16}$, each coupled to a corresponding one of capacitance elements 101, 102 ... 116. In the illustrated embodiment, each of switching devices $90_1 \ldots 90_{16}$ may be similar to the aforedescribed switching devices and, for example, may be formed of a transistor element. In such a construction, the collector-emitter circuit of each transistor element comprises the read-out circuit, and the transistor element is actuated, or rendered conductive, in response to a read-out pulse supplied to the base electrode thereof. Hence, when a switching device, such as switching device $90_1$ is actuated, the charge stored across the capacitance element to which it is connected, such as capacitance element 101, causes a current to flow through the output circuit of that switching device. The magnitude of this current is, of course, a direct function of the charge stored across the capacitance element which, in turn, is determined by the magnitude of the signal sample that had been supplied to and stored on that capacitance element.

In the embodiment shown in FIG. 2, a read clock generator 95 is coupled to read-out circuit 90 to supply respective phases of the read-out pulses thereto. Read clock generator 95 preferably is a plural stage read-out shift register, with each stage thereof being coupled to a respective switching device $90_1 \ldots 90_{16}$. A suitable source of read clock pulses (not shown) is coupled to shift register 95 to propagate a pulse from stage-to-stage through the shift register, thereby actuating switching devices $90_1 \ldots 90_{16}$ in sequence. An alternative source of read-out pulses is described below with respect to the embodiment illustrated in FIG. 5.

It should be appreciated that each read-out pulse that is provided at a respective stage of shift register 95 exhibits a duration sufficient to maintain its corresponding switching device $90_1 \ldots 90_{16}$ conductive for a period of time that is adequate to fully read out, or discharge, the capacitance element connected thereto. Furthermore, the level of the read-out pulse supplied to the switching device is high enough to bring the voltage across the capacitance element to a predetermined reference voltage level once the charge stored thereon has been fully read out. For example, let it be assumed that switching device $90_1$ is a bi-polar transistor whose base electrode is supplied with the read-out pulse of sufficient duration and of a magnitude equal to approximately 4 volts. The voltage stored across capacitance element 101 is determined by the magnitude of the signal sample supplied thereto by switching device $70_1$. This stored voltage across capacitance element 101 may be represented as $V_1$, and this voltage is determined by the charge $Q_1$ supplied to the capacitance element divided by the capacitance $C_1$ thereof. Hence, $V_1 = Q_1/C_1$. For the moment, let it be assumed that the capacitance $C_1$ is a constant value.

Now, when switching device $90_1$ is actuated by the 4-volt read-out pulse, the usual base-emitter voltage drop of approximately 0.7 volts results in an emitter voltage on the order of about 3.3 volts. The charge stored on capacitance element 101 now flows through the conductive switching device $90_1$ to generate a current therethrough having a magnitude determined by the magnitude of the stored charge. As the charge flows from capacitance element 101, the capacitance element is discharged such that the voltage $V_1$ thereacross increases toward the level of the voltage of the emitter of switching device $90_1$. It will be appreciated that this voltage increase is not instantaneous but, rather, is gradual over time. The magnitude of this voltage change $\Delta V$ is seen to be a function of the initial charge, or signal sample level, stored on the capacitance element. The quantity of charge which is read out from the capacitance element by switching device $90_1$ may be expressed as $Q_{out} = \Delta V \ C_1 = (3.3 - V_1) \ C_1$.

The quantity of the read out charge, which represents the input signal sample level, may be converted to a digital signal by a conventional A/D converter. Preferably, a precise integrating capacitor may be provided to receive the read out charge and thereby convert that charge to a corresponding potential level which, in turn, is digitized.

It will be appreciated that the duration of the read-out pulse is sufficient such that, at its conclusion, most if not all of the charge stored on, for example, capacitance element 101 will have been read out and, moreover, the voltage level now present across this capacitance element will be substantially equal to the reference voltage level. As a numerical example, if the read-out pulse magnitude is on the order of about 4 volts, the reference voltage level to which capacitance element 101 is reset is on the order of about 3.3 volts. In practice, the actual reference voltage level may be somewhat less than this 3.3 volt level due to, for example, the base-emitter capacitance of transistor element $90_1$, and other factors. Nevertheless, for a read-out pulse magnitude of about 4 volts, the reference voltage level to which capacitance element 101 is reset may be expected to be about 3.3 volts.

It is understood that the remaining capacitance elements are read out and reset by switching devices $90_2 \ldots 90_{16}$ in a substantially similar manner.

After all of the capacitance elements have been read out and thus reset, they are prepared to receive and store another set of signal samples. If desired, immediately prior to the storage, or writing in, of a signal sample to a particular capacitance element, the read-out switching device coupled to the capacitance element may be actuated to insure that the capacitance element is reset accurately to the aforementioned reference voltage level. This also will be explained below.

Figure 4:
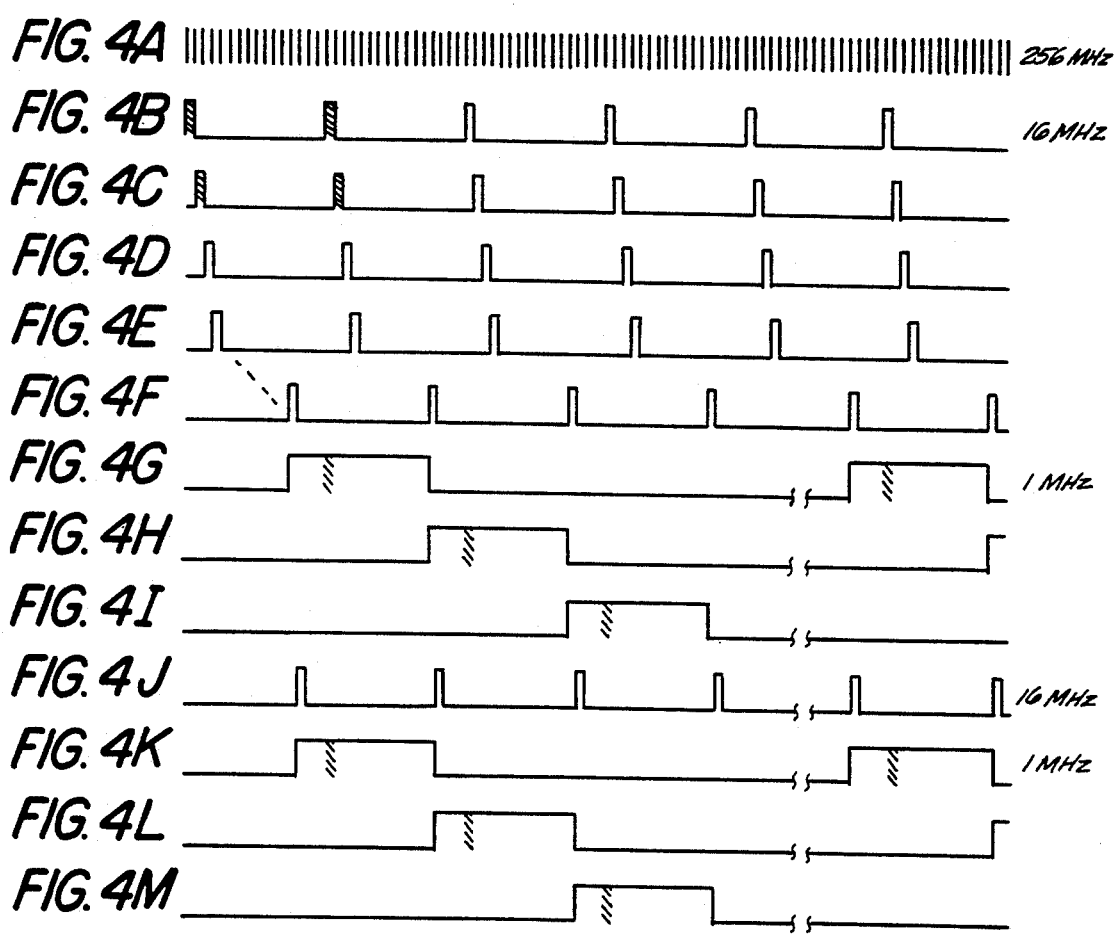
FIGS. 4A–4M are timing diagrams which are useful in understanding the operation of the embodiment shown in FIG. 2.

The timing diagrams illustrated in FIGS. 4A-4M represent the sequential sampling operations carried out by the input set of sampling circuits 60 and the output set of sampling circuits 70, 80 and so on. FIG. 4A represents the high frequency clock pulses supplied to shift register 62. The frequency of these clock pulses may be, for example 256 MHz. Each clock pulse (FIG. 4A) triggers shift register 62 to shift a pulse from one stage therein to the next adjacent stage. FIGS. 4B-4F represent the sampling pulses provided at the outputs of, for example, the first, second, third, fourth and twelfth stages of shift register 62.

Since shift register 62 is assumed herein to be, for example, a 16-stage shift register, it will be appreciated that the sampling pulse provided at the output of a respective stage thereof exhibits a frequency that is one-sixteenth the frequency of the input clock pulses. Hence, each stage of shift register 62 produces sampling pulses having a frequency of 16 MHz at a respective phase, as illustrated in FIGS. 4B-4F. Each sampling pulse actuates a respective switching device $60_1 \ldots 60_{16}$ coupled thereto. The cross-hatched areas shown in FIGS. 4B-4F represent the actuation of such switching devices and, thus, these cross-hatched areas represent the respective, sequential samples of the input signal.

As shown in FIG. 2, the input signal is supplied in common to the inputs, or emitter electrodes, of switching devices $60_1 \ldots 60_{16}$. Preferably, the input signal is an input current which may be generated by a voltage-to-current converter similar to converter 10 described above with respect to FIG. 1. Thus, when each switching device $60_1 \ldots 60_{16}$ is rendered conductive, an input current sample flows therethrough.

Each of shift registers 72, 82, ..., is coupled to a respective stage of shift register 62. Hence, the sampling pulses produced at the output of that respective stage serve to shift a pulse from one stage to the next adjacent stage in the shift register coupled thereto. For example, and as shown in FIG. 2, the twelfth stage of shift register 62 is coupled to the clock input of shift register 72. Thus, every sampling pulse provided at the output of the twelfth stage of shift register 62 triggers shift register 72 to propagate a pulse therethrough. The output of the twelfth stage of shift register 62 is illustrated in FIG. 4F, and FIGS. 4G-4I represent the pulse which is propagated through the first, second and third stages of shift register 72 in response to the pulses of FIG. 4F. Since shift register 72 is assumed to be a 16-stage shift register, it functions to divide the frequency of the sampling pulses supplied thereto from the twelfth stage of shift register 62 by the factor 16. Hence, each stage of shift register 72 produces sampling pulses of the frequency 1 MHz and at a respective phase, as illustrated in FIGS. 4G-4I, for example. The cross-hatched areas in FIGS. 4G-4I represent the input signal sample supplied to sampling circuit 70 by switching device $60_1$, which sample is transferred sequentially by switching devices $70_1, 70_2, 70_3$, and so on. Thus, although a switching device included in sampling circuit 70 is rendered conductive for a duration equal to about 62.5 nsec., the fact that switching device $60_1$ had been rendered conductive for approximately 4 nsec. means that the duration of the sample which is transferred through switching device $70_1$ is equal to about 4 nsec. Moreover, it is preferred that the input signal sample be transferred through switching device $70_1$ after the latter has been actuated for some period of time. It is for this reason that shift register 72 is driven by the sampling pulses derived from, for example, the twelfth stage of shift register 62 rather than from the fifteenth, sixteenth, first or second stages thereof. If desired, shift register 72 may be driven by the sampling pulses derived from any other stage of shift register 62, such as a stage from the third to the fourteenth stages.

Similarly, shift register 82 is driven from the sampling pulses derived from the thirteenth stage of shift register 62, such sampling pulses being illustrated in FIG. 4J. FIGS. 4K-4M illustrate the sequential sampling pulses that are provided at the first, second and third stages of shift register 82. Since sampling circuit 80, which is driven by shift register 82, is coupled to the output of switching device $60_2$, it is appreciated that an input signal sample produced by switching device $60_2$ is transferred through the particular switching device included in sampling circuit 80 that is rendered conductive. This is represented by the cross-hatched areas of FIGS. 4K-4M.

It is recognized that switching devices $60_1 \ldots 60_{16}$, included in the input sampling circuit 60, are actuated in sequence (FIGS. 4B-4F). The first input signal sample is produced by, for example, switching device $60_1$, and this sample is coupled to sampling circuit 70 and transferred to, for example, capacitance element 101 by switching device $70_1$ (FIG. 4G). The next input signal sample is produced by switching device $60_2$, and this sample is coupled to sampling circuit 80 whereat it is transferred to a capacitance element by, for example, switching device $80_1$ (FIG. 4K). The next-following sample is produced by switching device $60_3$, and this sample is coupled to another output sampling circuit (not shown) whereat it is transferred to a capacitance element by, for example, the first switching device included in that sampling circuit. This sequence continues until switching device $60_1$ is actuated once again. Then, the sample produced by this switching device is transferred by switching device $70_2$ to capacitance element 102. Then, switching device $60_2$ is actuated once again, and the sample produced by this switching device is transferred to a capacitance element (not shown) by the second switching device $80_2$ included in sampling circuit 80. As the next switching devices $60_3 \ldots 60_{16}$ are actuated in sequence, the second switching device included in each of the remaining output sampling circuits serve to transfer the successive input signal samples to respective capacitance elements.

After switching device $60_{16}$ is actuated, switching device $60_1$ is actuated once again. At this time, the third switching device $70_3$ included in output sampling circuit 70 is rendered conductive. Hence, the sample produced by switching device $60_1$ now is transferred to capacitance element 103 by this third switching device $70_3$. Thereafter, switching device $60_2$ is actuated to couple the sample produced thereby to sampling circuit 80. This sample is transferred by the third switching device $80_3$ included in sampling circuit 80 to the capacitance element (not shown) connected thereto. Then, as the remaining switching devices $60_3 \ldots 60_{16}$ are actuated in sequence, each of the third switching devices included in the remaining output sampling circuits is actuated to transfer the sample supplied thereto to a respective capacitance element.

From the foregoing description, it is readily seen that the first switching device included in each of the output sampling circuits 70, 80, ..., is rendered conductive, in sequence, to transfer the samples supplied sequentially thereto by the first sampling circuit 60. Then, each of the second switching devices included in the output sampling circuits is rendered conductive in sequence, and then each of the third switching devices is rendered conductive in sequence, and so on. Although the input clock pulses (FIG. 4A) are generated at, for example, the 256 MHz rate, thus sampling the input of signal at this rate, the output switching devices included in each of the output sampling circuits are actuated, or turned ON, at the much lower 1 MHz rate. This rate is sufficiently low to assure that each storage capacitance element is reset prior to being charged with a signal sample and, furthermore, to be charged accurately with that signal sample.

It is further seen that the writing in of samples to the capacitance elements and the reading out of such samples therefrom may be carried out independently. Thus, the read-out rate may be less than the write-in rate, if desired. Furthermore, to avoid interference between signal samples that might be written into the capacitance elements during a read-out operation, it is preferred that the aforedescribed sampling operation be inhibited during the read-out operation. For example, a reference level, such as a relatively higher potential level, may be supplied to the common-connected inputs, or emitter electrodes, of the switching devices included in input sampling circuit 60. Alternatively, this reference level may be supplied to the common-connected inputs, or emitter electrodes, of the switching devices included in each of the output sampling circuits 70, 80 and so on. Suitable circuitry (not shown) may be employed for this purpose.

Although not shown in FIG. 2, it may be appreciated that the read-out circuit coupled to each output sampling circuit, such as read-out circuit 90, may have its output terminal coupled to a buffer amplifier, such as a transistor. The output from each such buffer amplifier then may be connected in common to a single output terminal to which a conventional digitizing circuit may be connected. Such fanning in, or multiplexing, of the outputs from each of the read-out circuits reduces the capacitance provided at the output circuit which, in turn, enables a high response speed. Also, advantageously this minimizes the number of output pins that may be required if the sampling apparatus is constructed as an integrated circuit.

A portion of the embodiment shown in FIG. 2 is re-drawn in FIG. 5. In particular, FIG. 5 illustrates the output set, or level, of sampling circuits 70, 80, ... 150, each of these sampling circuits being coupled to the plural stages of a respective shift register 72, 82, ... 152. As discussed above, each sampling circuit is comprised of plural switching devices, illustrated herein as transistor elements, and each switching device is coupled to a respective stage of its associated shift register to be actuated in response to a pulse shifted into that stage. FIG. 5 also illustrates the analog storage devices, shown as capacitance elements, coupled to the outputs of each sampling circuit. Thus, the outputs of sampling circuit 70 are coupled to capacitance elements 101, 102, ... 116; the outputs of sampling circuit 80 are coupled to capacitance elements 121, 122, ... 136; and so on, with the outputs of sampling circuit 150 being coupled to capacitance elements 161, 162, ... 176.

FIG. 5 also illustrates the switching devices which are coupled to the capacitance elements for the dual purpose of resetting and reading out those capacitance elements. As shown, switching devices $90_1, 90_2 \ldots 90_{16}$ are coupled to capacitance elements 101, 102, ... 116, respectively; switching devices $120_1, 120_2, \ldots 120_{16}$ are coupled to capacitance elements 121, 122, ... 136, respectively; and switching devices $160_1, 160_2, \ldots 160_{16}$ are coupled to capacitance elements 161, 162, ... 176, respectively. In the embodiment described above with respect to FIG. 2, these switching devices are coupled to a separate read out shift register 95. In the embodiment illustrated in FIG. 5, the switching devices are coupled to the very same shift register as are the switching devices included in the respective sampling circuits. Thus, switching devices 90 are coupled to the respective stages of shift register 72, switching devices 120 are coupled to the respective stages of shift register 82 and switching devices 160 are coupled to the respective stages of shift register 152. As illustrated, a respective stage of a shift register, such as the first stage of shift register 72, is coupled to a switching device included in the sampling circuit, such as switching device $70_1$, and also to the next-following switching device included in the reset/read-out circuit, such as switching device $90_2$. That is, the first stage of the shift register is coupled to the first switching device included in the output sampling circuit and to the second switching device included in the reset/read-out circuit. The second stage of the shift register is coupled to the second switching device included in the output sampling circuit and also to the third switching device included in the reset/read-out circuit. Similar connections are made for the remaining switching devices, and as illustrated, the last stage of the shift register is coupled to the last switching device included in the output sampling circuit and also to the first switching device included in the reset/read-out circuit. Hence, when a pulse is shifted into a particular stage of the shift register, an input signal sample is written into one capacitance element and the next-following capacitance element is reset to a predetermined reference level.

The manner in which a capacitance element first is reset and then is charged to a level determined by an input signal sample written thereon is illustrated by the waveform diagrams shown in FIGS. 6A–6E. For convenience, these waveform diagrams are separated into write and read cycles. The present discussion is concerned with the write cycle whereby the capacitance elements are charged with input signal samples.

FIGS. 6A–6C illustrate the sampling pulses produced at the sixteenth, first and second stages, respectively, of shift register 72. As shown in FIG. 6D, the sampling pulse provided at the sixteenth stage of shift register 72 is supplied as a reset pulse to switching device $90_1$, whereupon the voltage at the emitter electrode thereof charges capacitance element 101 from whatever level then is stored thereon. As shown in FIG. 6D, the voltage across capacitance element 101 now is charged to the reference potential REF V. As an example, and as described above, if the voltage magnitude of the reset pulse supplied to switching device $90_1$ is on the order of about 4 volts, then, because of the 0.7 volts base-emitter voltage drop, the voltage at the emitter electrode of switching device $90_1$ is equal to about 3.3 volts. Hence, and as shown in FIG. 6D, the voltage across capacitance element 101 is charged to this reference voltage level of 3.3 volts.

As shown in FIGS. 6A and 6B, at the conclusion of the reset pulse produced at the sixteenth stage of shift register 72, a sampling pulse is produced at the first stage thereof. This sampling pulse is supplied to switching device $70_1$; and as is recalled from FIG. 4G, an input signal sample is coupled to switching device $70_1$ during this duration. This input signal sample is transferred by switching device $70_1$ to capacitance element 101. In the preferred embodiment, the signal sample is a current sample; and this current sample now charges the capacitance element to a corresponding level. Thus, the voltage across capacitance element 101 is reduced from its reset, or reference voltage level to a voltage level determined by the quantity of charge transferred thereto. As illustrated in FIG. 6D, this writing in of a current sample to capacitance element 101 decreases the voltage thereacross by $\Delta V$. This new voltage level (REF $V - \Delta V$) is stored across capacitance element 101 until read out therefrom, as will be described below.

As shown in FIG. 6E, the sampling pulse which is produced at the first stage of shift register 72 serves to actuate switching device $90_2$ so as to reset the next-following capacitance element 102. Thus, while capacitance element 101 is charged with a current sample, that is, during the write-in operation, the next-following capacitance element is reset to the reference voltage level. Thereafter, the sampling pulse produced by the first stage of shift register 72 terminates and the second stage thereof now produces the sampling pulse shown in FIG. 6C. As a result of this next-following sampling pulse, switching device $70_2$ is actuated to charge capacitance element 102 with the current sample now transferred through this switching device. Hence, the voltage across capacitance element 102 is reduced by the amount $\Delta V$, as illustrated. The voltage now stored across capacitance element 102 (REF $V - \Delta V$) remains thereon until read out.

As a numerical example, let it be assumed that the capacitance of each capacitance element is equal to 10 pf. If it is further assumed that, for example, the current which is transferred to the capacitance element results in the transfer of charge on the order of about 10 pc, then $\Delta V = Q/C = 10/10 = 1$. Hence, the voltage across the capacitance is reduced to the level $V_o = V_{REF} - \Delta V = 2.3$ volts.

If the charge which is transferred to the capacitance element by the current sample is on the order of, for example, 15 pc, then $\Delta V = 15/10 = 1.5$ volts. Hence, the voltage $V_o$ across the capacitance element is determined by $V_o = V_{REF} - \Delta V = 1.8$ volts.

It is appreciated that the voltage across the capacitance element is determined by the quantity of charge transferred thereto and is independent of the voltage-dependent characteristics of the capacitor. That is, some capacitive devices, and particularly those formed by semiconductor junctions, are known to exhibit capacitance levels which are affected by the voltage stored thereacross. Hence, as the stored voltage changes, the capacitance also changes, thereby affecting the accuracy with which the stored voltage may be measured. However, since charge is supplied to the capacitance element in the embodiment described herein, any changes in the capacitance because of the voltage thereacross will, nevertheless, not affect the quantity of charge which has been supplied thereto. Furthermore, since all of the stored charge is read out, and since this read out charge subsequently is converted to an analog voltage level by a precise capacitance device, there is no undue influence on the charge because of the voltage-dependent characteristics of the capacitance element. Accordingly, by using charge samples, errors in the signals read out from voltage-dependent capacitance elements are avoided.

The read cycle is similar to the aforedescribed write cycle, except that, if desired, the frequency of the read pulses generated by the shift registers may be reduced from the frequency of the sampling (reset) pulses. When the sixteenth stage, for example, of shift register 72 produces a read pulse, as shown in FIG. 6A, switching device $90_1$ is actuated. Accordingly, the voltage produced at the emitter thereof is increased to the reference voltage level REF V, as shown in FIG. 6D. The magnitude $\Delta V$ by which the voltage across capacitance element 101 changes is a function of the amount of charge stored thereon. Thus, as the capacitance element is discharged, the charge which had been stored thereacross is read out. As mentioned above, the current produced by reading out the charge stored across capacitance element 101 is integrated by a precise integrator and then digitized. In particular, switching device $90_1$ provides a current path from capacitance element 101 to the illustrated output terminal.

The read-out pulse produced by the first stage of shift register 72 also actuates switching device $90_2$ to read out the charge stored across capacitance element 102, as illustrated in FIG. 6E. Hence, the voltage across this capacitance element now is increased by the amount $\Delta V$ to the reference voltage level REF V.

As read-out pulses are produced sequentially by shift register 72, capacitance elements 101, 102 . . . 116 are read out in sequence in the manner described above. Likewise, as shift register 82 produces sequential read-out pulses, capacitance elements 121, 122, . . . 136 are read out in sequence. Thus, depending upon the frequency of the read-out pulses, the stored charges are read out from the capacitance elements and, as such stored charges are read, the capacitance elements are thereby reset.

While the present invention has been particularly shown and described with reference to certain preferred embodiments, it will be readily appreciated by those of ordinary skill in the art that various changes and modifications in form and details may be made without departing from the spirit and scope of the invention. For example, in the embodiment of FIG. 1, the input set 12 of switching devices is illustrated as being comprised of a single group. If desired, the input set may be formed of a plurality of groups. Likewise, any number of sets, or levels, of sampling circuits may be utilized, as desired. Each set, or level, of sampling circuits may be formed of any desired number of groups of switching devices, and each group likewise may be formed of any desired number of switching devices. In the embodiment of FIG. 1, for example, the intermediate set of sampling circuits is formed of two groups, and each of these two groups is comprised of four switching devices. If desired, this intermediate set, or level, of sampling circuits may be formed of a greater number of groups, and each group may be formed of a greater or lesser number of switching devices. Likewise, in the embodiment of FIG. 2, only an input set of switching devices and an output set are illustrated. The output set of switching devices is comprised of, for example, sixteen groups, each group being formed of sixteen switching devices. If the input sampling circuit of FIG. 2 is comprised of, for example, eight switching devices, then the output set of switching devices may be formed of eight groups, each group containing any desired number of switching devices. Also, in the embodiment of FIG. 2, an intermediate set, or level, of sampling circuits may be provided between the illustrated input set and the output set, if desired. Still further, the output set, or level, of switching devices shown in FIGS. 1 and 2 may, if desired, be formed of charge coupled devices (CCD) rather than simple switching transistors. Furthermore, the separate shift registers which are used with each group of switching devices may be replaced by comparable counter and decoder circuits which supply pulses of different frequencies and phases to the respective sets of switching devices coupled thereto. In addition, although bi-polar transistors have been particularly shown and described as the illustrated switching devices, other conventional switching elements which are capable of operating at the frequencies described herein may be used. Also, although the present invention is particularly adapted to sample at very high frequencies, relatively low sampling frequencies may be used, if desired. Hence, the present invention can be used in the range 10 MHz to 10,000 MHz without difficulty or loss in accuracy.

What is claimed is:

1. High-speed commutating apparatus for commutating an input current, comprising a plurality of cascaded sets of current switching means, including an input set and an output set, each set including at least one current switching circuit having an input and plural outputs and responsive to clock signals supplied thereto for switching a current applied to said input to predetermined ones of said outputs, the input of a current switching circuit in one set being coupled to a respective output of a current switching circuit in a preceding set to receive the current switched to said respective output; current converting means for converting an input signal to a corresponding current, said current converting means being coupled to the input of the current switching circuits of said input set of current switching means; capacitance means coupled to the respective outputs of the current switching circuits of said output set of current switching means to store the currents switched to the respective outputs of said output set; reset means for resetting each said capacitance means in advance of switching current to the respective output of said output set to which said capacitance means is coupled; read-out means coupled to said capacitance means for reading out the values of said stored currents; and clock signal generating means for generating plural sets of clock signals, each set of clock signals being supplied to the current switching circuits of a respective set of said current switching means.

2. The apparatus of claim 1 wherein the current switching circuits included in said output set are comprised of plural groups of current switching elements each having an input, an output and a control terminal, the inputs of the current switching elements in each respective group being connected in common to a respective one f the outputs of the current switching circuits in the preceding set and the control terminals of the current switching elements in each of the respective groups being supplied with a respective set of clock signals; and wherein said reset means resets each capacitance means coupled to the output of the current switching elements in a respective group in advance of the supplying of clock signals to those current switching elements in said respective group.

3. The apparatus of claim 2 wherein said clock signal generating means comprises plural sets of shift registers including an input set and an output set, said output set of shift registers being comprised of plural shift registers each having plural stages coupled to the control terminals, respectively, of a respective group of current switching elements; each of said shift registers being coupled to receive a respective clock signal from a preceding set of shift registers for shifting a pulse through said stages.

4. The apparatus of claim 1 wherein the current switching circuits included in said output set are comprised of plural groups of current switching elements each having an input, an output and a control terminal, the inputs of the current switching elements in each group being connected in common to a respective one of the outputs of the current switching circuits in the preceding set and the control terminals of the current switching elements in each group being supplied with a respective set of clock signals for actuating the current switching elements in said group; and wherein said clock signal generating means comprises plural sets of shift registers including an input set and an output set of shift registers, said output set of shift registers including plural shift registers each having plural stages coupled to the control terminals, respectively, of a respective group of current switching elements, each of said shift registers being coupled to receive a respective clock signal from a preceding set of shift registers for shifting a pulse through the stages thereof to actuate successive ones of the current switching elements coupled thereto; and wherein said reset means comprises plural reset switch means each coupled to a respective capacitance means and actuated prior to the actuation of the current switching element coupled to that capacitance means for supplying a reference voltage level to that capacitance means.

5. The apparatus of claim 4 wherein a respective current switching element that is coupled to one capacitance means is coupled to the same stage of a shift register as the reset switch means that is coupled to the next succeeding capacitance means.

6. The apparatus of claim 4 wherein said read-out means comprises said plural reset switch means; and means for supplying successive read out switch pulses at a read out rate to said reset switch means to actuate said reset switch means and read out the charge stored on successive ones of said capacitance means.

7. The apparatus of claim 6 wherein each read out switch pulse is of a predetermined magnitude and duration such that each reset switch means is actuated thereby to supply a predetermined potential level to the capacitance means coupled thereto, whereby the voltage across said capacitance means changes from the level determined by the actuation of said switching element to said predetermined potential level.

8. The apparatus of claim 7 wherein said means for supplying successive read out switch pulses to said reset switch means comprises a source of read clock pulses, and reset shift register means having plural stages each coupled to a respective reset switch means, said reset shift register means being coupled to said source of read clock pulses to shift read out switch pulses through successive ones of said stages.

9. The apparatus of claim 7 wherein said means for supplying successive read out switch pulses to said reset switch means comprises said plural shift registers, and means for supplying respective read clock signals to each of said shift registers.

10. Apparatus for high-speed current switching, comprising: a source of high speed clock pulses; first switching pulse generating means coupled to said source to derive a first set of switching pulses at a first frequency no less than about 100 MHz having respective first switch phases; an input terminal for receiving an input current to be switched; first current switching means coupled to said input terminal and to said first switching pulse generating means and having plural first outputs, said first current switching means being responsive to respective ones of said switching pulses in said first set to switch said input current and thereby obtain at said plural first outputs a first set of input currents at said respective first switch phases; a plurality of second pulse generating means, each coupled to receive a respective one of said first switch phases of said first set of switching pulses for deriving therefrom a second set of switching pulses at a second, lower frequency having respective second switch phases; a plurality of second current switching means, each coupled to a respective first output to receive a respective one of the input currents in said first set and to receive predetermined ones of said second set of switching pulses, each second current switching means having plural second outputs and being responsive to said predetermined ones of said second set of switching pulses for passing said respective one input current and thereby obtain at said plural second outputs a set of switched input currents, each second current switching means being comprised of plural current switching elements having common-connected inputs coupled to receive said respective one input current, each current switching element having a control terminal coupled to receive a respective one of the switching pulses in said second set of switching pulses and an output coupled to a respective one of said second outputs for producing thereat a respective switched input current; a capacitance element coupled to the output of a respective current switching element for storing said produced switched input current; and a transistor switch means coupled to a respective capacitance element and responsive to a switching pulse for resetting the voltage across said respective capacitance element before a switched input current is stored thereon and further responsive to a read pulse for reading out said switched input current.

11. The apparatus of claim 10 wherein said switching pulse is a predetermined switching pulse in said second set of switching pulses.

* * * * *